(12) United States Patent
Yamaguchi et al.

(10) Patent No.: US 10,396,009 B2
(45) Date of Patent: Aug. 27, 2019

(54) HEAT DISSIPATION MATERIAL AND METHOD OF MANUFACTURING THEREOF, AND ELECTRONIC DEVICE AND METHOD OF MANUFACTURING THEREOF

(71) Applicant: FUJITSU LIMITED, Kawasaki-shi, Kanagawa (JP)

(72) Inventors: Yoshitaka Yamaguchi, Kawasaki (JP); Taisuke Iwai, Sagamihara (JP); Masaaki Norimatsu, Atsugi (JP); Yukie Sakita, Atsugi (JP); Shinichi Hirose, Yokohama (JP); Yohei Yagishita, Isehara (JP)

(73) Assignee: FUJITSU LIMITED, Kawasaki (JP)

( * ) Notice: Subject to any disclaimer, the term of this patent is extended or adjusted under 35 U.S.C. 154(b) by 78 days.

(21) Appl. No.: 15/455,292

(22) Filed: Mar. 10, 2017

(65) Prior Publication Data
US 2017/0186664 A1    Jun. 29, 2017

Related U.S. Application Data

(60) Division of application No. 14/166,109, filed on Jan. 28, 2014, now Pat. No. 9,635,784, and a continuation
(Continued)

(51) Int. Cl.
*H01L 23/36*    (2006.01)
*H01L 23/367*   (2006.01)
(Continued)

(52) U.S. Cl.
CPC ...... *H01L 23/3672* (2013.01); *H01L 21/4882* (2013.01); *H01L 21/50* (2013.01);
(Continued)

(58) Field of Classification Search
USPC .......................................... 361/708
See application file for complete search history.

(56) References Cited

U.S. PATENT DOCUMENTS

2006/0231946 A1    10/2006   Pan et al.
2008/0291634 A1*   11/2008   Weiser ..................... C09K 5/14
                                                              361/708
(Continued)

FOREIGN PATENT DOCUMENTS

CN    101540302    9/2009
CN    201725788    1/2011
(Continued)

OTHER PUBLICATIONS

Kinoshita et al "Synthesis and mechanical properties of carbon nanotube/diamond-like carbon composite films" Diamond & Related Materials 16 (2007) p. 1940-1944. (Year: 2007).*
(Continued)

*Primary Examiner* — Archene A Turner
(74) *Attorney, Agent, or Firm* — Fujitsu Patent Center

(57) ABSTRACT

A heat dissipation material includes a plurality of linearly-structured objects of carbon atoms configured to include a first terminal part and a second terminal part; a first diamond-like carbon layer configured to cover the first terminal part of each of the plurality of linearly-structured objects; and a filler layer configured to be permeated between the plurality of linearly-structured objects.

6 Claims, 14 Drawing Sheets

Related U.S. Application Data of application No. PCT/JP2011/071864, filed on Sep. 26, 2011.

(51) Int. Cl.

| | |
|---|---|
| *H01L 23/373* | (2006.01) |
| *H01L 23/433* | (2006.01) |
| *H01L 21/50* | (2006.01) |
| *H05K 7/20* | (2006.01) |
| *H01L 21/48* | (2006.01) |

(52) U.S. Cl.
CPC ........ *H01L 23/373* (2013.01); *H01L 23/3732* (2013.01); *H01L 23/3738* (2013.01); *H01L 23/433* (2013.01); *H05K 7/2039* (2013.01); *H01L 2224/73204* (2013.01); *H01L 2224/73253* (2013.01); *Y10T 428/24802* (2015.01); *Y10T 428/24851* (2015.01)

(56) References Cited

U.S. PATENT DOCUMENTS

| | | | |
|---|---|---|---|
| 2009/0066352 | A1 | 3/2009 | Gritters et al. |
| 2009/0197484 | A1 | 8/2009 | Chen et al. |
| 2009/0237886 | A1 | 9/2009 | Iwai et al. |
| 2010/0021736 | A1 | 1/2010 | Slinker et al. |
| 2010/0083489 | A1 | 4/2010 | Eldridge et al. |
| 2010/0124023 | A1 | 5/2010 | Lin |
| 2010/0124025 | A1 | 5/2010 | Yamaguchi et al. |
| 2010/0243227 | A1 | 9/2010 | Wu et al. |
| 2010/0302740 | A1 | 12/2010 | Mouli et al. |
| 2012/0213713 | A1 | 8/2012 | Yamaguchi et al. |
| 2012/0325454 | A1* | 12/2012 | Iwai .................. H01L 23/373 165/185 |

FOREIGN PATENT DOCUMENTS

| | | |
|---|---|---|
| EP | 2104141 | 9/2009 |
| JP | 2002-151873 | 5/2002 |
| JP | 2009-260238 | 11/2009 |
| JP | 2010-507098 | 3/2010 |
| JP | 2010-118609 | 5/2010 |
| JP | 2010-177405 | 8/2010 |
| JP | 2011-057466 | 3/2011 |
| JP | 2011-096832 | 5/2011 |
| WO | 2011-111112 | 9/2011 |

OTHER PUBLICATIONS

Liang et al "Improvement of environmental stability of carbon nanotube cold cathode with diamond-like carbon coating" 24th International Vacuum Nanoelectronics Conference Jul. 2011. (Year: 2011).*

International Search Report, mailed in connection with PCT/JP2011/071864 and dated Oct. 18, 2011.

JPOA—Office Action dated Feb. 24, 2015 issued with respect to the corresponding Japanese Patent Application No. 2013-535652, with partial English translation.

EESR—Extended European Search Report dated Jun. 10, 2015 issued with respect to the corresponding European Patent Application No. 11873281.7.

CNOA—Office Action dated Nov. 12, 2015 issued with respect to the corresponding Chinese Patent Application No. 201180072665.8, with Full English translation of office action.

JPOA—Office Action dated Apr. 26, 2016 issued with respect to the corresponding Japanese Patent Application No. 2013-535652, with partial English translated office action.

JPOA—Office Action dated Nov. 4, 2015 issued with respect to the corresponding Japanese Patent Application No. 2013-535652, with partial English translation.

USPTO, (Turner) Notice of Allowance and Notice of Allowbility, dated Jan. 27, 2017, in parent U.S. Appl. No. 14/166,109 [allowed].

USPTO, (Turner) Non-Final Rejection, dated Aug. 11, 2016, in parent U.S. Appl. No. 14/166,109 [allowed].

USPTO, (Datskovskiy) Restriction Requirement, dated Nov. 2, 2015, in parent U.S. Appl. No. 14/166,109 [allowed].

* cited by examiner

HEAT DISSIPATION MATERIAL AND METHOD OF MANUFACTURING THEREOF, AND ELECTRONIC DEVICE AND METHOD OF MANUFACTURING THEREOF

CROSS-REFERENCE TO RELATED APPLICATIONS

This application is a divisional of application Ser. No. 14/166,109, filed Jan. 28, 2014, which is a continuation application of International Application PCT/JP2011/071864 filed on Sep. 26, 2011 and designated the U.S., the entire contents of which are incorporated herein by reference.

FIELD

The disclosures herein generally relate to a heat dissipation material including a linearly-structured object made of carbon atoms and a method of manufacturing thereof, and an electronic device and a method of manufacturing thereof.

BACKGROUND

Electronic devices used in servers, CPUs (Central Processing Units) in personal computers, and the like are required to efficiently dissipate heat that is generated by semiconductor devices. Therefore, such an electronic device may have a structure having a heat spreader attached immediately above the semiconductor device that is made of a material having high thermal conductivity such as copper.

In this case, as the surfaces of a heat generation source and a heat spreader have fine concavities and convexities, a sufficient contact area cannot be obtained even when having the interface surface works as a great thermal resistance, which hinders efficient heat dissipation. Therefore, it is practiced in which a heat generation source and a heat spreader are connected with each other via a thermal interface material (TIM) where the objective is to reduce the contact thermal resistance.

To achieve the objective, such a thermal interface material is itself required to be a material having high thermal conductivity, and to have a characteristic that makes it possible to make contact with a large area with respect to the fine concavities and convexities on the surfaces of a heat generation source and a heat spreader.

Conventionally, a heat dissipation grease, a phase-change material (PCM), indium, or the like is used as such a thermal interface material. One of the major features of these materials used as a heat dissipation material is that it is possible with these materials to obtain a large contact area regardless of the fine concavities and convexities because these materials have high fluidity at an operating temperature limit of an electronic device or below.

However, such a heat dissipation grease or a phase-change material has low thermal conductivity of 1 W/m·K to 5 W/m·K. Also, indium is a rare metal whose price has been rising due to a great increase of demand related to ITO, hence inexpensive alternative materials have been anticipated.

With the background as such, a linearly-structured object made of carbon atoms represented by a carbon nanotube attracts attention as a heat dissipation material. A carbon nanotube is a material not only having a very high thermal conductivity (1500 W/m·K to 3000 W/m·K) in its axial direction, but also superior flexibility and heat resistance, which is considered to have a high potential as a heat dissipation material.

Thermally-conductive sheets using carbon nanotubes have been proposed including a thermally-conductive sheet having carbon nanotubes dispersed in resin, a thermally-conductive sheet having a bundle of carbon nanotubes contained with resin where the carbon nanotubes are made by oriented growth, and the like.

RELATED-ART DOCUMENTS

Patent Documents

[Patent Document 1] Japanese Laid-open Patent Publication No. 2009-260238
[Patent Document 2] Japanese Laid-open Patent Publication No. 2010-177405

However, conventional thermally-conductive sheets using carbon nanotubes cannot fully utilize high thermal conductivity of carbon nanotubes.

SUMMARY

According to at least one embodiment of the present invention, a heat dissipation material includes a plurality of linearly-structured objects of carbon atoms configured to include a first terminal part and a second terminal part; a first diamond-like carbon layer configured to cover the first terminal part of each of the plurality of linearly-structured objects; and a filler layer configured to be permeated between the plurality of linearly-structured objects.

The object and advantages of the embodiment will be realized and attained by means of the elements and combinations particularly pointed out in the claims. It is to be understood that both the foregoing general description and the following detailed description are exemplary and explanatory and are not restrictive of the invention as claimed.

DESCRIPTION OF EMBODIMENTS

First Embodiment

A heat dissipation material and its manufacturing method will be described according to the first embodiment using FIGS. 1-7.

Figure 1:
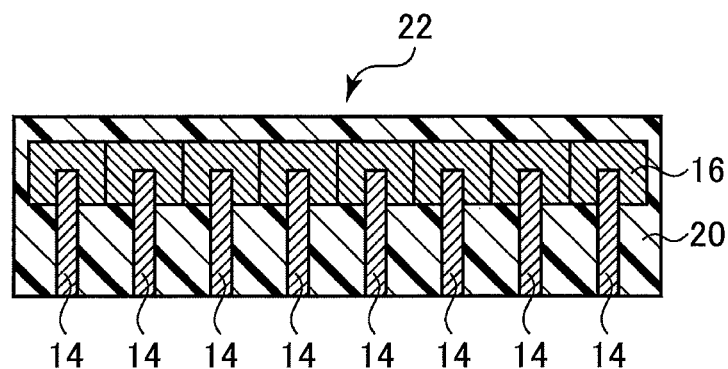
FIG. 1 is a plan view illustrating a structure of a heat dissipation material according to a first embodiment.
Figure 2A:
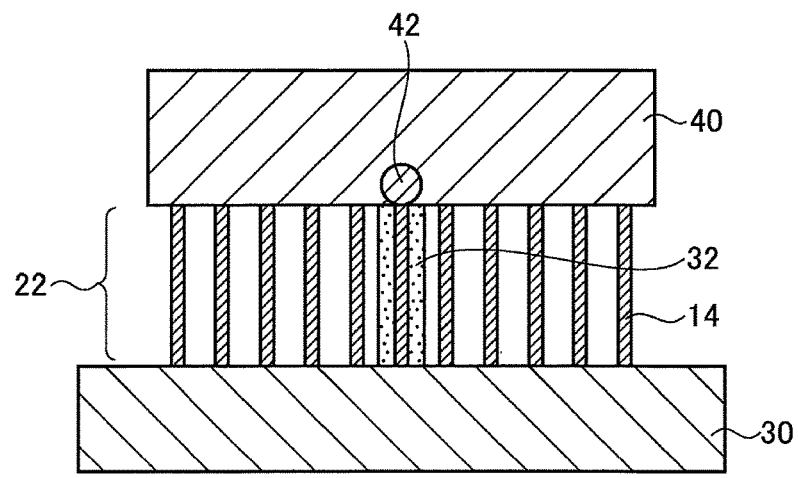
FIGS. 2A-2C are schematic views illustrating an effect of a coating film of DLC.
Figure 2B:
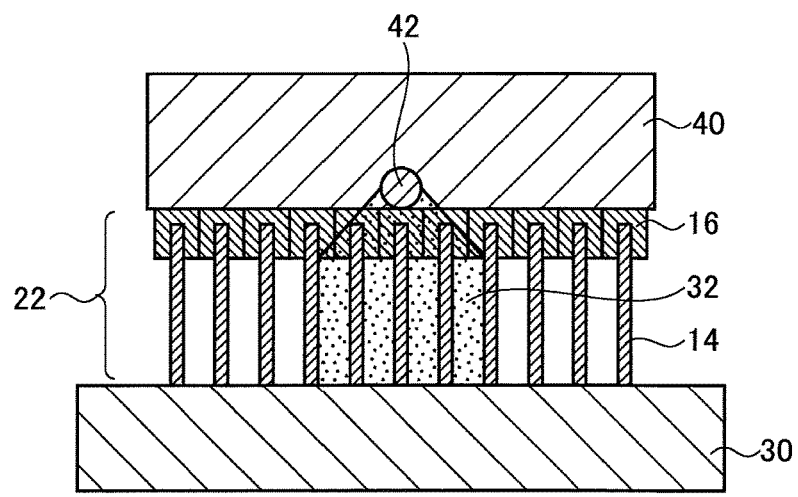
Figure 2C:
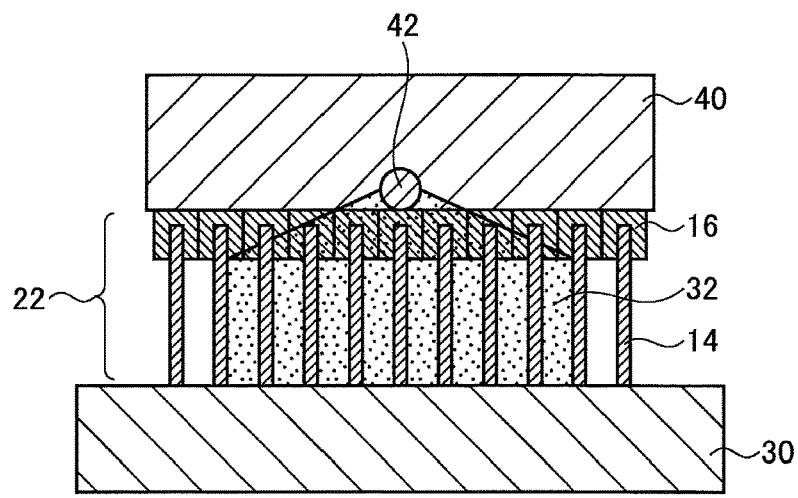
Figure 4A:
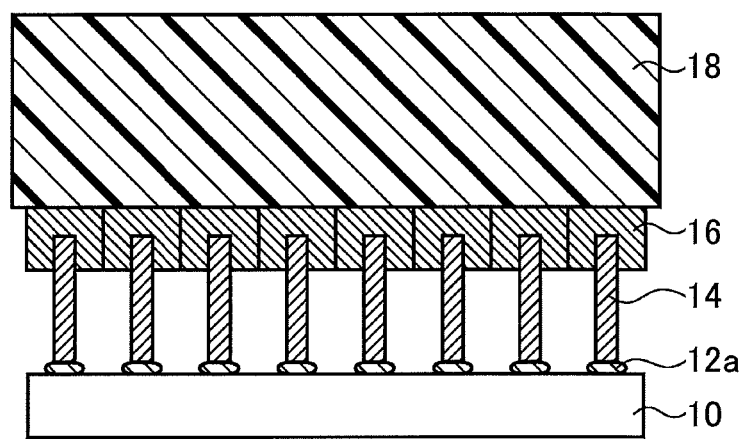
FIGS. 4A-4C are second process cross-sectional views illustrating a method of manufacturing a heat dissipation material according to the first embodiment.
Figure 4B:
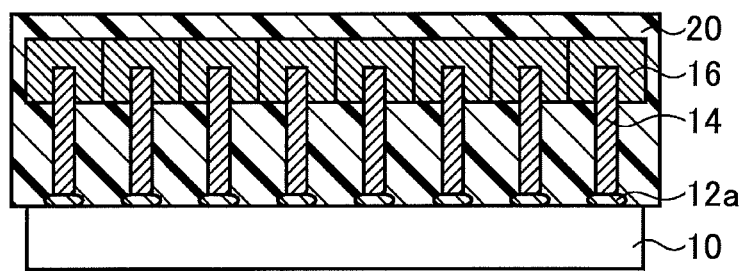
Figure 5:
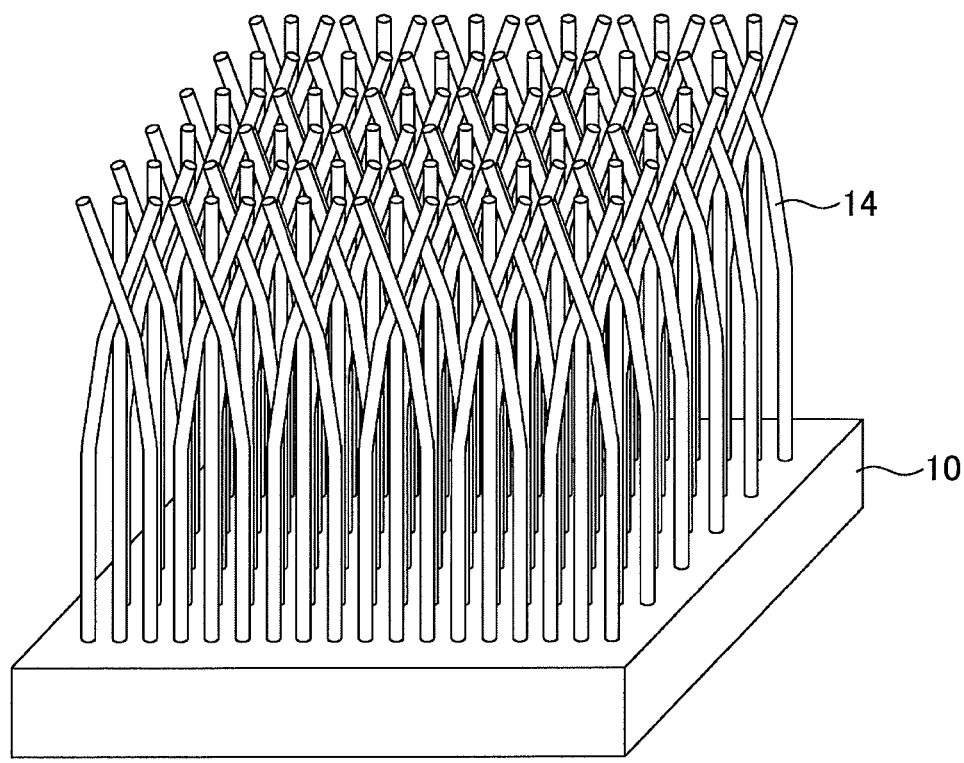
FIG. 5 is a first perspective view illustrating a method of manufacturing a heat dissipation material according to the first embodiment.
Figure 6:
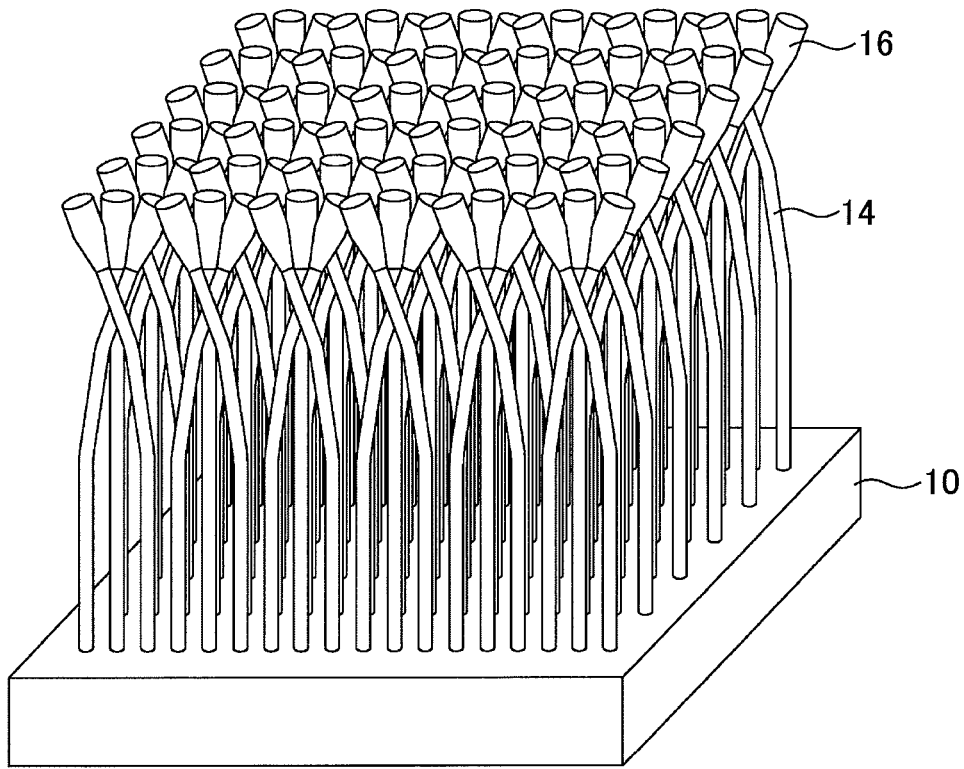
FIG. 6 is a second perspective view illustrating a method of manufacturing a heat dissipation material according to the first embodiment.
Figure 7:
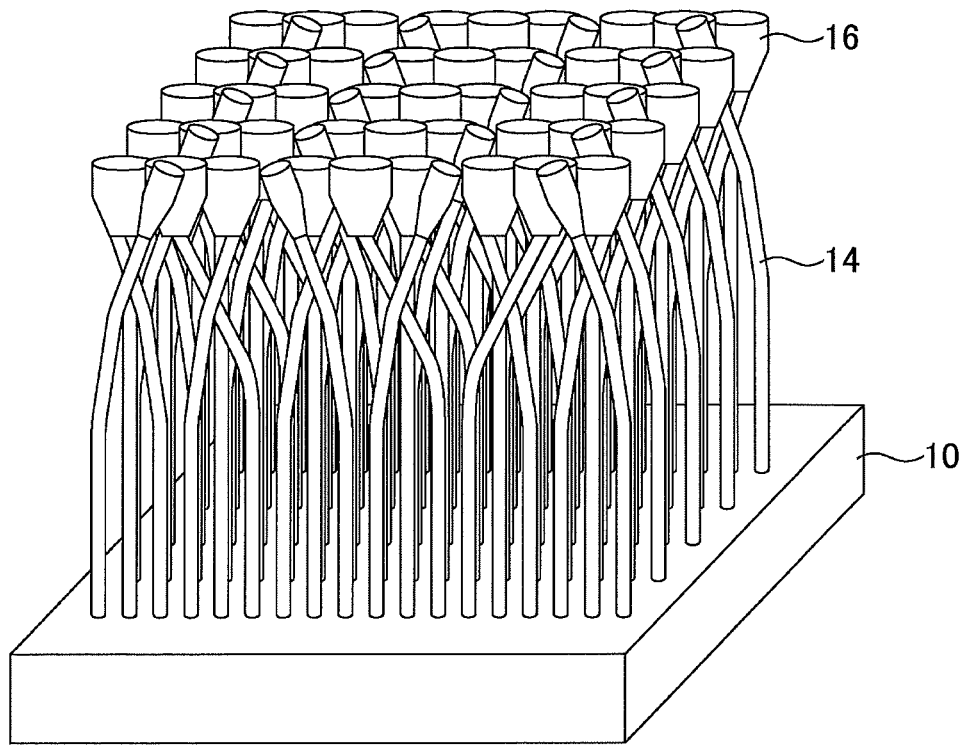
FIG. 7 is a third perspective view illustrating a method of manufacturing a heat dissipation material according to the first embodiment.

FIG. 1 is a general cross-sectional view illustrating a structure of a heat dissipation material according to the present embodiment. FIGS. 2A-2C are schematic views illustrating an effect of a coating film of DLC. FIGS. 3A-3D and 4A-4C are process cross-sectional views illustrating methods of manufacturing a heat dissipation material according to the present embodiment. FIGS. 5-7 are perspective views illustrating methods of manufacturing a heat dissipation material according to the present embodiment.

First, the structure of the heat dissipation material 22 will be described according to the first embodiment using FIG. 1.

The heat dissipation material 22 includes multiple carbon nanotubes 14 as illustrated in FIG. 1 according to the present embodiment. At one terminal part of each of the multiple carbon nanotubes 14, a coating film 16 of diamond-like carbon is formed. Gaps between the carbon nanotubes 14 having coating films 16 formed are filled with a filler layer 20. These elements form the sheet-shaped heat dissipation material 22.

The multiple carbon nanotubes 14 are oriented in the film thickness direction, namely in a direction crossing the surfaces of the sheet, and placed having intervals between each other.

The carbon nanotube 14 may be either of a single-layer carbon nanotube or a multi-layer carbon nanotube. The area density of the carbon nanotube 14 is not specifically limited, but it is desirable to have greater than $1 \times 10^{10}$ tubes/cm$^2$ from the viewpoints of heat radiation and electric conductivity.

The length of the carbon nanotube 14 is not specifically limited, but it may be preferably set to a value of 5 μm to 500 μm. If using the heat dissipation material 22 according to the present embodiment as a thermal interface material formed between a heat generation source (for example, an IC chip) and a heat dissipation part (for example, a heat spreader), it is desirable to have a length sufficient for filling concavities and convexities on the surface of the heat generation source and heat dissipation part or a longer length.

The coating film 16 is formed of diamond-like carbon (called "DLC", hereafter). DLC is a carbon material having an intermediate crystal structure between diamond and graphite. DLC is an amorphous material that includes carbon as the principal element and a bit of hydrogen in which both diamond bonds (SP3 bond) and graphite bonds (SP2 bond) coexist. Also, DLC has a low friction coefficient, an anti-cohesion property, and heat conductivity as high as that of graphite.

DLC and a carbon nanotube are allotropes to each other and have an affinity to each other. Also, DLC has mainly an amorphous structure partially with a graphite structure, which is a substance in which π electrons exist. On the other hand, a carbon nanotube is a cylindrically-shaped structured object of graphene as a basic structured object of graphite, in which π electrons exist. Therefore, a carbon nanotube and DLC are bonded together more tightly by sp2 π-π interaction. Therefore, the bond between the carbon nanotube 14 and the coating film 16 of DLC is strong, which makes contact thermal resistance between the carbon nanotube 14 and the coating film 16 of DLC very small.

The coating film 14 may be formed at each of the terminal parts at one end of each of the multiple carbon nanotubes 12 independently, or may be formed so that the adjacent coating films 16 are connected with each other when formed on the carbon nanotubes 12.

By providing the coating films 16, the contact area can be increased where a heat dissipation material such as a heating element, a heat dissipation element, or the like makes a junction with an adherend, and contact thermal resistance can be reduced. The thermal conductivity of DLC is about 1000 [W/m·K], which is as high as that of graphite, whereas an increase of thermal resistance is very small when the coating film 16 is formed.

Also, if the DLC layer is formed so that the coating films 16 are connected with each other that are formed at the terminal parts of the carbon nanotubes 14, heat from a heating element can be spread in the lateral direction by the coating films 16 to increase the number of carbon nanotubes 14 that contribute to thermal conduction. Also, if there is a variation of lengths of the carbon nanotubes 14 that prevents a part of the carbon nanotubes 14 from contacting the heat element, it is possible to make the part of the carbon nanotubes 14 contribute to heat dissipation with thermal conduction in the lateral direction via the coating films 16. In this way, the heat dissipation efficiency of the heat dissipation material 22 can be improved.

For example, as illustrated in FIG. 2, suppose a case where there is a heat dissipation material 22 including multiple carbon nanotubes 14 between a heat dissipation element 30 such as a heat spreader, and a heating element 40 such as an Si chip. In addition, assume that a heat generation source 42 of the heating element 40 resides in a certain part of the heating element 40 and the thermal conduction of the heating element in the lateral direction is small.

If coating films 16 are not formed at the terminal parts of the carbon nanotubes 14, only the carbon nanotube 14 immediately below the heat generation source 42 heating element 40 mainly contributes as a heat dissipation path 32 from the heat generation source 42 to the heat dissipation element 30 (see FIG. 2A). Heat from the heat generation source 42 is transferred to the heat dissipation element 30 via the carbon nanotube 14 immediately below the heat generation source 42 to be dissipated.

On the other hand, if coating films 16 are formed at the terminal parts of the carbon nanotubes 14, heat from the heat generation source 42 is first spread in the lateral direction by the coating films 16, then transferred to the heat dissipation element 30 via the carbon nanotubes 14. Therefore, the number of the carbon nanotubes 14 contributing as heat dissipation paths 32 increases, which leads to a higher heat dissipation efficiency from the heating element 40 to the heat dissipation element 30 (see FIG. 2B).

If the coating films 16 of DLC are formed that have higher thermal conductivity, heat from the heat generation source 42 can be spread more in the lateral direction by the coating films 16, which can further increase the number of the carbon nanotubes 14 contributing as heat dissipation paths 32. In this way, the heat dissipation efficiency from the heating element 40 to the heat dissipation element 30 can be further improved (see FIG. 2C).

For example, comparing a case where coating films 16 are formed of copper (the thermal conductivity is about 400 [W/m·K]) with a case where the coating films 16 are formed of DLC (the thermal conductivity is about 1000 [W/m·K]), the effective contact area can be made about 2.5 times greater with DLC.

If the coating films 16 are formed with a metal material, contact thermal resistance is greater because the junction between the carbon nanotube and the metal is physical adsorption. Also, as metal tends to aggregate and is difficult to form a film, it is difficult to have the terminal parts of the adjacent carbon nanotubes 14 connect together in the lateral direction with coating films made of metal. This point of view also justifies to reduce contact thermal resistance and to improve thermal conductivity in the lateral direction by forming the coating films 16 with DLC, which is better than a case where the coating film is formed with metal.

It is noted that graphite is an electrically-conductive material having the electrical resistivity of about $10^{-3}$ Ω·cm, whereas DLC is an insulating material having the electrical resistivity of $10^9$ Ωcm to $10^{14}$ Ω·cm. The heat dissipation material 22 having the coating films of DLC 16 is an insulating material that conducts heat but does not conduct electricity.

Also, parts where the coating films of DLC 16 are formed have a low friction coefficient that makes a filler material to be more water-repellent than in the other parts, which has an effect to reduce resin residual on the coating films 16. This makes it possible to reduce resin residual considerably between the heating element or heat dissipation element and the coating films 16 that may remain when attaching the heat dissipation material 22 to the heating element and heat dissipation element, and to improve contact thermal resistance.

The filler layer 20 may be made of a material with no specific restrictions as long as it can be filled between the carbon nanotubes 14, for example, a resin material such as a silicone resin, an epoxy resin, an acrylic resin, or a metal material such as silver paste. Among these, a thermoplastic resin is preferable as a filler material. A thermoplastic resin reversibly changes its phase between liquid state and solid state depending on temperature. It is desirable to use a thermoplastic resin that is in a solid-state at room temperature, changes into liquid state when applied to heat, and returns back to a solid-state when cooled down while exhibiting adherence.

A thermoplastic resin that forms the filler layer 20 can be selected based on the melting temperature of the thermoplastic resin by considering a heat generation temperature or the like of an electronic device to which the heat dissipation material 22 in the present embodiment is applied. It is desirable that the lower limit value of the melting temperature of a thermoplastic resin is higher than the upper limit value of a heat generation temperature during operation. This is because there is a risk in that if the thermoplastic resin melts during operation, the heat dissipation material 22 deforms, which impairs the orientation of the carbon nanotubes 14, and the heat conductivity is lowered. It is desirable that the upper limit value of the melting temperature of the thermoplastic resin is lower than the lower limit value of temperature range of the heating element and the heat dissipation element. This is because it is desirable to apply reflow to the filler layer 20 and the heat dissipation material 22 after contacting the heat element, and it is difficult to apply reflow without damaging the heating element and/or the heat dissipation element if the melting temperature of the thermoplastic resin is higher than the limit temperature.

For example, if the heat dissipation material 22 according to the present embodiment is applied to an electronic device such as a CPU for heat dissipation, and assuming that the upper limit heat generation temperature of the CPU is about 125° C. and the limit temperature of the electronic device including the CPU is about 250° C., then it is preferable to use the thermoplastic resin whose melting temperature is 125° C. to 250° C.

Also, in the filler layer 20, an additive may be dispersed and mixed if necessary. As an additive, one may consider a material having high thermal conductivity. By dispersing and mixing an additive having thermal conductivity into the filler layer 20, the thermal conductivity of the filler layer 20 can be improved, which also improves the thermal conductivity of the heat dissipation material 22 as a whole. As a material having high thermal conductivity, it is possible to use a carbon nanotube, a metal material, aluminum nitride, silica, alumina, graphite, fullerene, or the like.

Next, a method of manufacturing the heat dissipation material will be described according to the present embodiment using FIGS. 3-7.

Figure 3A:
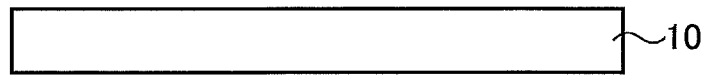
FIGS. 3A-3D are first process cross-sectional views illustrating a method of manufacturing a heat dissipation material according to the first embodiment.

First, a substrate 10 is provided as a basis for growing carbon nanotubes 14 (FIG. 3A). The substrate 10 does not have any specific restrictions, but it is possible to use, for example, a semiconductor substrate such as a silicon substrate, an insulating substrate such as an alumina (sapphire) substrate, an MgO substrate, a glass substrate, or a metal substrate as the substrate 10. Also, the substrate 10 may have a thin film formed on it. For example, it is possible to use a silicon substrate that has a silicon dioxide film formed with the film thickness of about 300 nm.

The substrate 10 is to be delaminated after growth of the carbon nanotubes 14. Considering this objective, it is desirable that the substrate 10 does not change its properties at a growth temperature of the carbon nanotubes 14. Also, it is desirable that at least a surface contacting the carbon nanotubes 14 is formed with a material that can be easily delaminated from the carbon nanotubes 14. Alternatively, the substrate 10 may be formed with a material that can be selectively etched at least on regions contacting the carbon nanotubes 14.

Figure 3B:

Next, on the substrate 10, an Fe (iron) film with the film thickness of, for example, 2.5 nm is formed with, for example, sputtering to form an Fe catalyst metal film 12 (FIG. 3B). Here, the catalyst metal film 12 is not necessarily formed on the whole surface of the substrate 10, but may be selectively formed on predetermined regions of the substrate 10 using, for example, a liftoff process.

As a catalyst metal other than Fe, Co (cobalt), Ni (nickel), Au (gold), Ag (silver), Pt (platinum), or an alloy including at least one of these materials may be used. Also, as a catalyst other than a metal film, metal fine particles may be used that are produced using a differential mobility analyzer (DMA) or the like to control their size in advance. In this case, the same metals as for the thin film can be used.

Also, as the base film of these catalyst metals, a film may be formed that is made of Mo (molybdenum), Ti (titanium), Hf (hafnium), Zr (zirconium), Nb (niobium), V (vanadium), TaN (tantalum nitride), TiSi$_x$ (titanium silicide), Al (aluminum), Al$_2$O$_3$ (aluminum oxide), TiO$_x$ (titanium oxide), Ta (tantalum), W (tungsten), Cu (copper), Au (gold), Pt (platinum), Pd (palladium), TiN (titanium nitride) or the like, or an alloy including at least one of these materials. For example, a stack structure of Fe (2.5 nm)/Al (10 nm), a stack structure of Co (2.6 nm)/TiN (5 nm), or the like may be used. If using metal fine particles, for example, a stack structure of Co (average diameter of 3.8 nm)/TiN (5 nm) or the like may be used.

Next, the carbon nanotubes 14 are grown on the substrate 10 using, for example, a hot filament CVD method and the catalyst metal film 12 as a catalyst. The catalyst metal film 12 aggregates into catalyst metal fine particles 12a with heat applied during growth. The carbon nanotubes 14 are grown using the catalyst metal fine particles 12a as a catalyst.

Growth conditions of the carbon nanotubes 14 include that, for example, mixed gas of acetylene-argon (division ratio 1:9) is used as raw material gas; the total gas pressure in a film-forming chamber is set to 1 kPa; the hot filament temperature is set to 1000° C.; and growth time is set to 20 minutes. Under these conditions, it is possible to grow multi-layer carbon nanotubes that have three to six layers (on the average, four layers), the diameter of 4 nm to 8 nm (on the average, 6 nm), the length of 80 μm (growth rate is 4 μm/min). Here, the carbon nanotubes 14 may be formed using another film forming method such as a thermal CVD method or a remote plasma CVD method. Also, carbon nanotubes to be grown may be single-layer carbon nanotubes. Also, as a raw carbon material other than acetylene, hydrocarbons such as methane or ethylene, or alcohol such as ethanol, methanol, or the like may be used.

The length of the carbon nanotubes 14 are not specifically limited, but may be preferably set to 5 μm to 500 μm. To be used as a thermal interface material, it is desirable to have the length covering at least concavities and convexities on the surfaces of the heat generation source and the heat dissipation element.

Figure 3C:
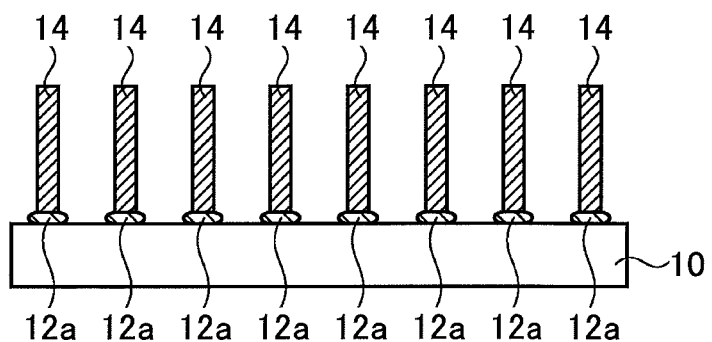

In this way, multiple carbon nanotubes 14 are formed on the substrate 10 oriented in the normal direction of the substrate 10, namely, vertically oriented (FIG. 3C). Formed under the above growth conditions, the area density of the carbon nanotubes 14 is about $1 \times 10^{11}$ tubes/cm$^2$. This is equivalent to an area formed with the carbon nanotubes 14 occupying 10% of the surface area of the substrate 10.

Here, although the carbon nanotubes 14 grown on the substrate 10 grow by oriented growth in the normal direction of the substrate 10 as a whole, the tips are not necessarily directed in the normal direction of the substrate 10, which reflects an initial stage of growth where growth processes occur in random directions, for example, as illustrated in FIG. 5.

Figure 3D:
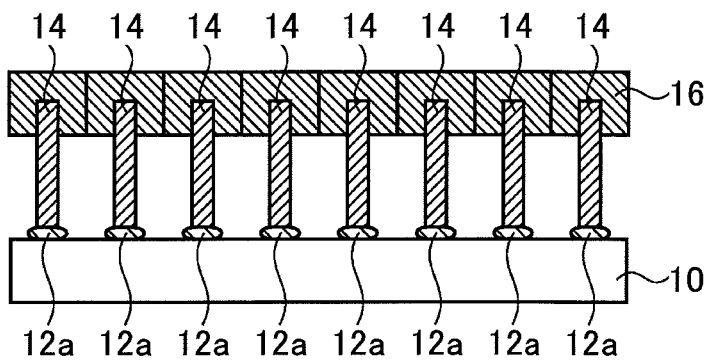

Next, for example, using a plasma CVD method, DLC is stacked with the film thickness of, for example, 100 nm, to form coating films 16 of DLC at the upper terminal parts of the carbon nanotubes 14 (FIG. 3D). The growth conditions of DLC are set, for example, to use acetylene gas as raw material gas, and to have the film forming temperature at 100° C. Here, when growing DLC, a catalyst is not required which is required for growing a carbon nanotube or graphite.

A film forming method of DLC is not specifically limited. Other than a plasma CVD method, a thermal CVD method, sputtering, a laser ablation method, an ion beam method, or the like may be used.

Here, if forming with a CVD method, a series of processes from growth of the carbon nanotubes 14 to film forming of the coating films 16 may be applied consecutively in the same device. If the growth of the carbon nanotubes 14 and the film forming of the coating films 16 are performed consecutively in the same device without exposure to the atmosphere, it is possible to improve an interface characteristic between the carbon nanotubes 14 and the coating films 16. For example, the carbon nanotubes 14 are grown by a thermal CVD device using the growth temperature of 650° C. and acetylene as raw material gas, then, the coating films 16 of DLC are grown by the same thermal CVD device using the film forming temperature of 200° C. and acetylene as raw material gas.

The growth temperature of DLC is not specifically limited, but it is preferably set to a range between room temperature and about 300° C. Also, a raw material of DLC is not specifically limited, but solid carbon, methane, benzene, acetylene, or the like may be used.

DLC has a feature that it can be formed uniformly into a film having a complex form, hence it can be formed uniformly into films at the terminal parts of the carbon nanotubes 14. The coating films 16 are formed to cover the tips of the carbon nanotubes 14, for example, at an initial stage of growth as illustrated in FIG. 6. With increased growth film thickness, the coating films 16 formed at the tips of the adjacent carbon nanotubes 14 come into contact with each other. This makes the coating films 16 form so that the tips of the multiple carbon nanotubes 14 are bundled together, for example, as illustrated in FIG. 7. By further increasing the growth film thickness of the coating films 16, the coating films 16 are connected with each other in two-dimensional directions parallel to the surface of the sheet to have a single film shape.

It is desirable to set the film thickness of the coating films 16 appropriately depending on the diameter and area density of the carbon nanotubes 14 while considering permeability of a filler material for forming the filler layer 20 or the like. From the viewpoint of connecting the carbon nanotubes 14 with each other, it is desirable to have a film thickness of the coating films 16 in a range of 10 nm to 500 nm.

Here, the coating films 16 do not necessarily need to be formed to have a film thickness sufficient for connecting the adjacent carbon nanotubes 14 with each other, but it has an effect of supporting the carbon nanotubes 14 by the coating films 16. This can prevent the carbon nanotubes 14 from being unbundled in a later process in which the filler layer 20 is permeated into the carbon nanotubes 14. Also, heat can be conducted in the lateral direction via the coating films 16.

Next, a filler material is filled into gaps between the carbon nanotubes 14 whose terminal parts have the coating films 16 of DLC coated, to form the filler layer 20.

The filler material is not specifically limited as long as it can fill the gaps between the carbon nanotubes 14. Also, a method of forming the filler layer 20 is not specifically limited. However, various advantages may be obtained if using a thermoplastic resin, and in addition, having been processed into a film shape. Here, an example of a method of forming the filler layer 20 will be described that uses a film-shaped thermoplastic resin.

First, thermoplastic resin processed to have a film-shaped form (thermoplastic resin film 18) is placed on the carbon nanotubes 14 having the coating films 16 formed.

Thermoplastic resin used for the thermoplastic resin film 18 may be, for example, hot melt resin as follows. Polyamide-based hot melt resin includes, for example, "Micromelt 6239" made by Henkel Japan Ltd. Also, polyester-based hot melt resin includes, for example, "DH598B" made by Nogawa Chemical Co., Ltd. Also, polyurethanebased hot melt resin includes, for example, "DH722B" made by Nogawa Chemical Co., Ltd. Also, polyolefin-based hot melt resin includes, for example, "EP-90" made by Matsumura Oil Co., Ltd. Also, ethylene-copolymer-based hot melt resin includes, for example, "DA574B" made by Nogawa Chemical Co., Ltd. Also, SBR-based hot melt resin includes, for example, "M-6250" made by Yokohama Rubber Co., Ltd. Also, EVA-based hot melt resin includes, for example, "3747" made by Sumitomo 3M Limited. Also, butyl-rubber-based hot melt resin includes, for example, "M-6158" made by Yokohama Rubber Co., Ltd.

Here, for example, a case will be described in which "Micromelt 6239" made by Henkel Japan Ltd. is used that has been processed to take a film-shaped form with the thickness of 100 μm to be used as the thermosetting resin film 18. Here, "Micromelt 6239" is a hot melt resin that has a melting temperature of 135° C. to 145° C., and viscosity in a melted state of 5.5 Pa·s to 8.5 Pa·s (225° C.).

Next, heat is applied to the substrate 10 having the thermoplastic resin film 18 in place at a temperature higher than the melting temperature of the thermoplastic resin that forms the thermoplastic resin film 18. If using the above thermoplastic resin material, for example, heat is applied at the temperature of 195° C. If necessary, pressure may be applied to the thermoplastic resin film 18 from the top. This makes the thermoplastic resin of the thermoplastic resin film 18 melt to permeate into gaps between the carbon nanotubes 14.

The depth of the permeation of the thermoplastic resin film 18 into the gaps of the carbon nanotubes 14 may be selected appropriately. For example, if the permeation of the thermoplastic resin film 18 is stopped at a depth where the substrate 10 is yet to be reached, it has an advantage that the carbon nanotubes 14 and the thermoplastic resin film 18 can be delaminated from the substrate 10 easier. Also, the heat dissipation material 22 can be formed that has the terminal parts of the carbon nanotubes 14 exposed from the filler layer 20, which enables the carbon nanotubes 14 to make direct contact with the heat dissipation material 22 when attached to a heat dissipation element or a heating element, and to reduce the contact thermal resistance. If adhesion of thermoplastic resin film 18 to the substrate 10 is low, the thermoplastic resin film 18 may be permeated to reach the substrate 10.

The depth of the permeation of the thermoplastic resin film 18 into the gaps of the carbon nanotubes 14 can be controlled by the heat application time. For example, for the carbon nanotubes 14 grown to the length of 80 μm under the above conditions, the thermoplastic resin film 18 can be permeated to a depth where the substrate 10 is yet to be reached by applying heat at 195° C. for one minute. It is desirable to set the heat application time for the thermoplastic resin film 18 appropriately depending on the length of the carbon nanotubes 14, the viscosity of the thermoplastic resin in a melted state, the film thickness of the thermoplastic resin film 18, and the like so as to make the thermoplastic resin film 18 permeate to a desired depth.

The amount of the filler material to be filled into the carbon nanotubes 14 can be controlled by the sheet film thickness of the thermoplastic resin film 18. By forming the thermoplastic resin into a sheet-shaped form in advance, the amount of the filler material can be controlled easier. Here, although it is preferable to process the thermoplastic resin to have a sheet-shaped form in advance, the form may be in a pellet-shaped or rod-shaped form.

Next, after having the thermoplastic resin film 18 permeated to a predetermined position, it is cooled down to room temperature to solidify the thermoplastic resin film 18. Thus, the filler layer 20 is formed by the thermoplastic resin of the thermoplastic resin film 18 that fills up the gaps between the carbon nanotubes 14 (FIG. 4B).

Figure 4C:
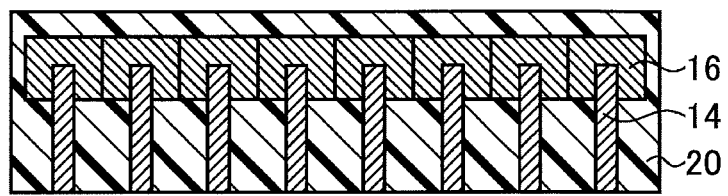

Next, the filler layer 20, in which the carbon nanotubes 14 having the coating films 16 formed are buried, is delaminated from the substrate 10 to complete the heat dissipation material 22 according to the present embodiment (FIG. 4C).

As seen from the above, according to the present embodiment, coating films of DLC are provided at terminal parts of carbon nanotubes included in a heat dissipation material, hence it is possible to reduce contact thermal resistance of the heat dissipation material to an adherend such as a heating element, a heat dissipation element, or the like. Also, by connecting the terminal parts of the multiple carbon nanotubes with each other by the coating films of DLC, it is possible to improve heat conductivity in the lateral direction and heat dissipation efficiency.

Second Embodiment

A heat dissipation material and its manufacturing method will be described according to the second embodiment using FIGS. 8-10. Substantially the same elements as in the heat dissipation material and its manufacturing method according to the first embodiment illustrated in FIGS. 1-7 are assigned the same numerical codes and their description may be omitted or simplified.

Figure 8:
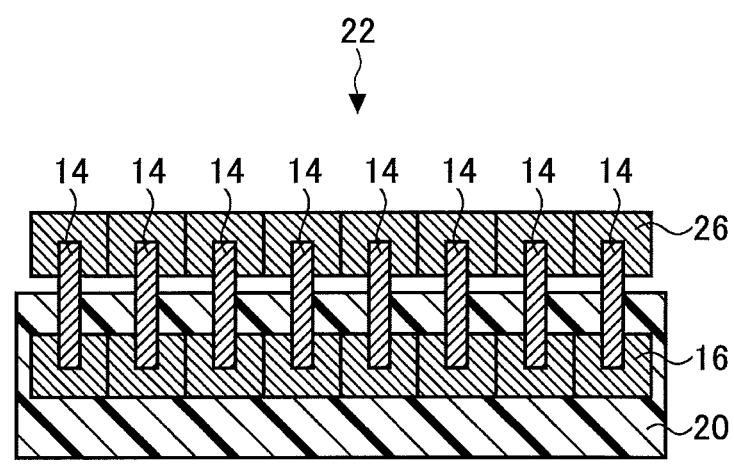
FIG. 8 is a plan view illustrating a structure of a heat dissipation material according to a second embodiment.

FIG. 8 is a general cross-sectional view illustrating a structure of a heat dissipation material according to the present embodiment. FIGS. 9A-9C and 10A-10C are process cross-sectional views illustrating methods of manufacturing a heat dissipation material according to the present embodiment.

First, the structure of the heat dissipation material will be described according to the present embodiment using FIG. 8.

The heat dissipation material 22 includes multiple carbon nanotubes 14 as illustrated in FIG. 8 according to the present embodiment. At one terminal part of each of the multiple carbon nanotubes 14, a coating film 16 of DLC is formed. At the other terminal part of each of the multiple carbon nanotubes 14, a coating film 26 of DLC is formed. Gaps between the carbon nanotubes 14 having the coating films 16 and 26 formed are filled with the filler layer 20. These elements form the sheet-shaped heat dissipation material 22. The other terminal parts of the carbon nanotubes 14 having the coating films 26 formed are exposed from the filler layer 20.

As seen from the above, the heat dissipation material 22 includes the carbon nanotubes 14 whose terminal parts both have the coating films 16 and 26 formed, respectively, according to the present embodiment. This can reduce contact thermal resistance to an adherend on both surfaces of the heat dissipation material 22.

Next, a method of manufacturing the heat dissipation material 22 will be described according to the present embodiment using the FIGS. 9A-9C and 10A-10C.

Figure 9A:
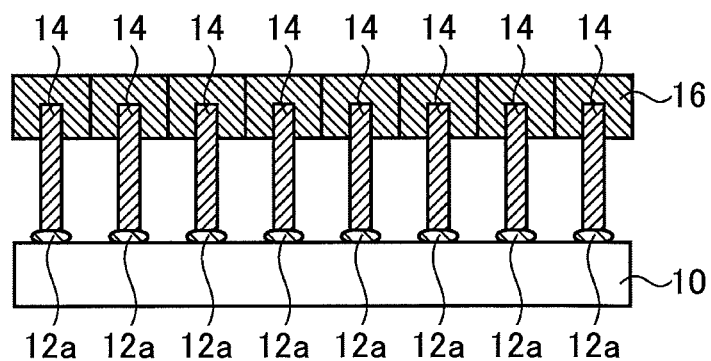
FIGS. 9A-9C are first process cross-sectional views illustrating a method of manufacturing a heat dissipation material according to the second embodiment.

First, for example, multiple carbon nanotubes 14 and the coating films 16 of DLC covering the terminal parts of the carbon nanotubes 14 are formed on the substrate 10 in a similar way to the method of manufacturing the heat dissipation material according to the first embodiment illustrated in FIGS. 3A-3D (FIG. 9A).

Figure 9B:
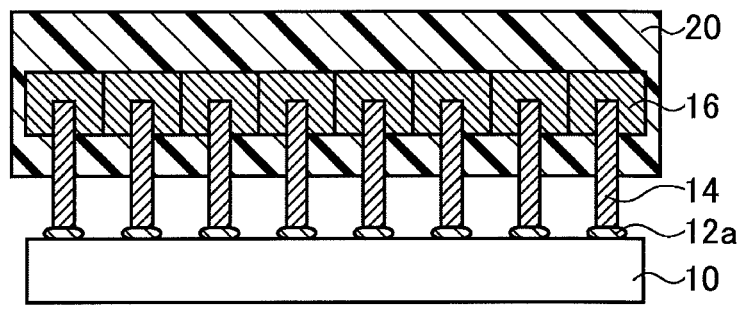

Next, for example, similarly to the method of manufacturing the heat dissipation material according to the first embodiment illustrated in FIGS. 4A-4B, a thermoplastic resin film 18 is permeated into the carbon nanotubes 14 to form a filler layer 20. At this moment, heat application time is adjusted appropriately to prevent the thermoplastic resin film 18 from reaching the substrate 10 (FIG. 9B).

For example, "DA3251" adhesive made by Nogawa Chemical Co., Ltd. (softening temperature of 155° C. to 165° C.) is processed to have a film-shaped form to obtain a thermoplastic resin film 18, which is then placed onto the carbon nanotubes 14 having the coating films 16 formed, for five minutes of heat application with a reflow temperature of 150° C. This makes the thermoplastic resin film 18 permeate into the carbon nanotubes 14 to a depth where the substrate 10 is yet to be reached.

Figure 9C:
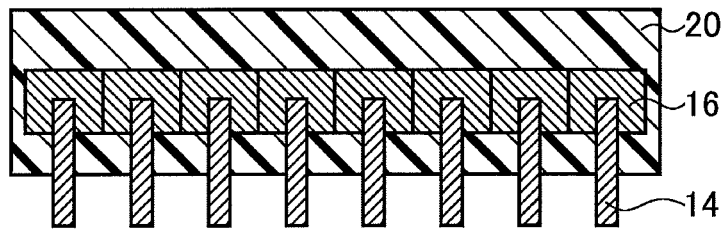

Next, the filler layer 20, in which the carbon nanotubes 14 having the coating films 16 formed are buried, is delaminated from the substrate 10 (FIG. 9C).

Figure 10A:
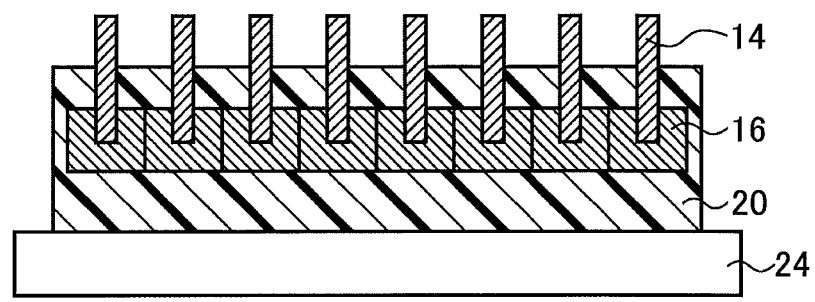
FIGS. 10A-10C are second process cross-sectional views illustrating a method of manufacturing a heat dissipation material according to the second embodiment.

Next, the filler layer 20 delaminated from the substrate 10 is attached to another substrate 24 so that the surface having the filler layer 20 formed faces the substrate 24 (FIG. 10A).

Figure 10B:
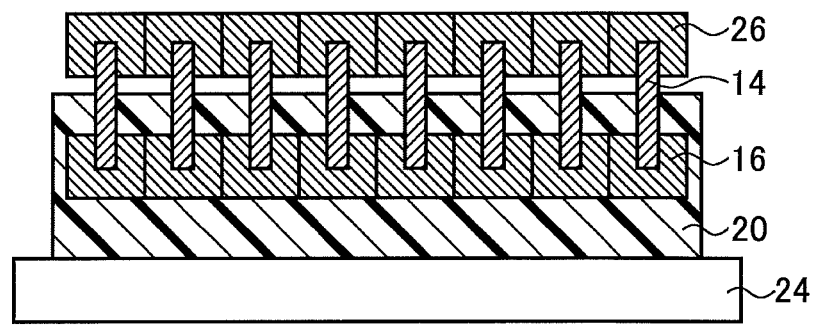

Next, on the other terminal parts of the carbon nanotubes 14 delaminated from the substrate 10, the coating films 26 of DLC having the film thickness of, for example, 100 nm are formed in a similar way to the method of forming the coating films 16 (FIG. 10B).

At this moment, it is desirable to set the film forming temperature for the coating films 26 at a temperature lower than the softening temperature of thermoplastic resin that forms the filler layer 20. If the film forming is performed at a temperature higher than the softening temperature of the thermoplastic resin, the thermoplastic resin will melt during the film forming, which makes it difficult to keep the form of the filler layer 20 and carbon nanotubes 14 unchanged. In this regard, the coating films 26 of DLC can be formed without changing the form of the filler layer 20 and carbon nanotubes 14 because the film forming can be performed at a comparatively low-temperature from room temperature to 300° C.

Here, in case of graphite, a film forming temperature over 600° C. is required, which makes it difficult to form the coating films 26 with graphite after forming the filler layer 20.

Figure 10C:
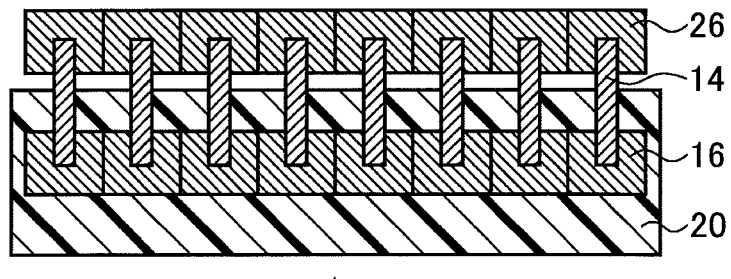

Next, the filler layer 20, in which the carbon nanotubes 14 whose terminal parts have the coating films 16 and 26 formed are buried, is delaminated from the substrate 24 to complete the heat dissipation material 22 according to the present embodiment (FIG. 10C).

As seen from above, according to the present embodiment, coating films of DLC are provided at terminal parts of carbon nanotubes included in a heat dissipation material, hence it is possible to reduce contact thermal resistance of the heat dissipation material to an adherend such as a heating element, a heat dissipation element, or the like. Also, by connecting the terminal parts of the multiple carbon nanotubes with each other by the coating films of DLC, it is possible to improve heat conductivity in the lateral direction and heat dissipation efficiency.

Third Embodiment

A heat dissipation material and its manufacturing method will be described according to the third embodiment using FIGS. 11-12D.

Substantially the same elements as in the heat dissipation material and its manufacturing method according to the first and second embodiments are assigned the same numerical codes and their description may be omitted or simplified.

Figure 11:
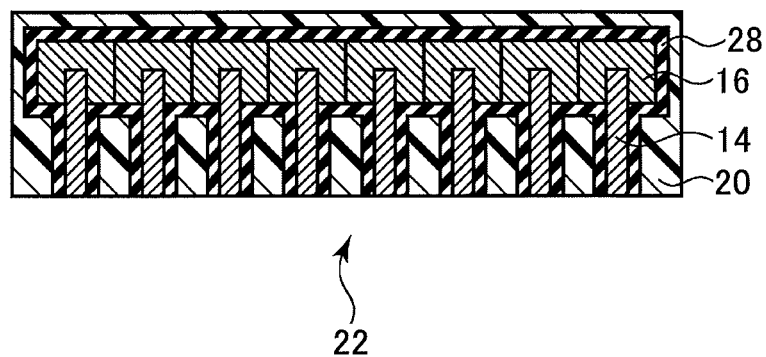
FIG. 11 is a plan view illustrating a structure of a heat dissipation material according to a third embodiment.

FIG. 11 is a general cross-sectional view illustrating a structure of a heat dissipation material according to the present embodiment. FIGS. 12A-12D are process cross-sectional views illustrating a method of manufacturing a heat dissipation material according to the present embodiment.

First, the structure of the heat dissipation material will be described according to the first embodiment using FIG. 11.

The heat dissipation material 22 includes multiple carbon nanotubes 14 as illustrated in FIG. 11 according to the present embodiment. At one terminal part of each of the multiple carbon nanotubes 14, a coating film 16 of DLC is formed. The surfaces of the carbon nanotubes 14 and the coating films 16 have a coating film 28 formed uniformly. Gaps between the carbon nanotubes 14 having the coating films 16 and 28 formed are filled with the filler layer 20. These elements form the sheet-shaped heat dissipation material 22.

The coating film 28 is a thin film having the film thickness of 1 nm to 20 nm formed by an atomic layer deposition (ALD) method, which covers the surfaces of the carbon nanotubes 14 and coating films 16 uniformly.

By forming the coating film 28 to cover the surfaces of the carbon nanotubes 14 and coating films 16, especially the side surfaces of the carbon nanotubes 14, it is possible to improve mechanical strength of the carbon nanotubes 14 in the vertical direction. This makes it possible to improve resistance to compression load during assembly.

Materials of the coating film 28 are not specifically limited, but an oxide material or a metal material may be preferably used. Concrete examples include aluminum oxide, titanium oxide, hafnium oxide, iron oxide, indium oxide, lanthanum oxide, molybdenum oxide, niobium oxide, nickel oxide, ruthenium oxide, silicon oxide, vanadium oxide, tungsten oxide, yttrium oxide, zirconium oxide, manganese, iron, cobalt, nickel, copper, silver, lanthanum, and the like.

The film thickness of the coating film 28 depends on the area density and length of the carbon nanotubes 14, which may be preferably set to, for example, about 20 nm if the area density of the carbon nanotube 14 is about $1 \times 10^{10}$ tubes/$cm^2$.

Next, a method of manufacturing the heat dissipation material 22 will be described according to the present embodiment using FIGS. 12A-12D.

Figure 12A:
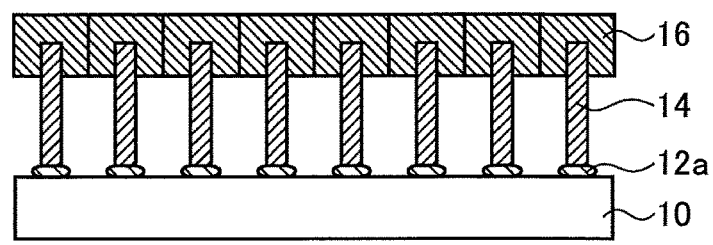
FIGS. 12A-12D are process cross-sectional views illustrating a method of manufacturing a heat dissipation material according to the third embodiment.

First, for example, the multiple carbon nanotubes 14 and the coating films 16 of DLC covering the terminal parts of the carbon nanotubes 14 are formed on the substrate 10 in a similar way to the method of manufacturing the heat dissipation material according to the first embodiment illustrated in FIGS. 3A-3D (FIG. 12A).

Figure 12B:
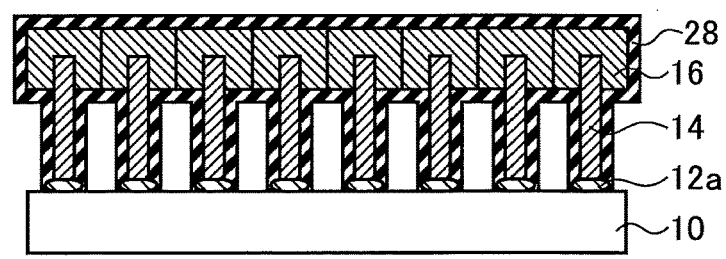

Next, by an ALD method, the coating film 28 of aluminum oxide ($Al_2O_3$) having the film thickness of, for example, 20 nm is formed on the surfaces of the carbon nanotubes 14 having the coating films 16 formed (FIG. 12B). For example, a film of aluminum oxide with the film thickness of 20 nm is obtained by performing the ALD method for 200 cycles with trimethylaluminum (TMA) and water ($H_2O$) as raw material gas under conditions of film forming temperature of 200° C. and total pressure of 0.5 MPa. By using the ALD method, it is possible to form the coating film 28 having a uniform film thickness on the whole surfaces of the carbon nanotubes 14 having the coating film 16 formed.

Figure 12C:
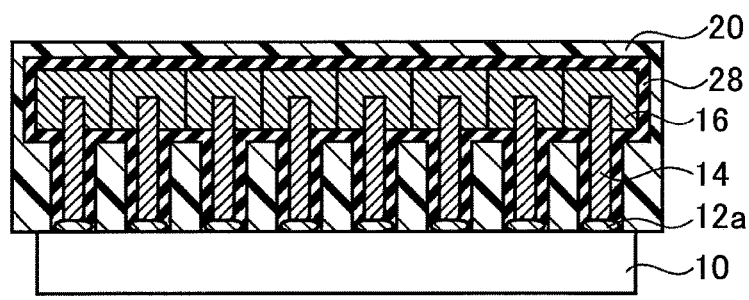

Next, the filler layer 20 is formed in gaps between the carbon nanotubes having 14 the coating films 16 and 28 formed, for example, in a similar way to the method of manufacturing the heat dissipation material according to the first embodiment illustrated in FIGS. 4A-4D (FIG. 12C).

Figure 12D:
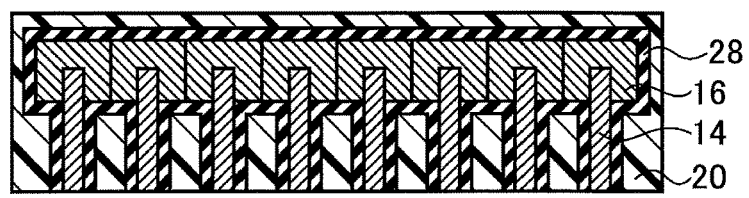

Next, the filler layer 20, in which the carbon nanotubes 14 having the coating films 16 and 28 formed are buried, is delaminated from the substrate 10 to complete the heat dissipation material 22 according to the present embodiment (FIG. 12D).

As seen from the above, according to the present embodiment, coating films of DLC are provided at terminal parts of carbon nanotubes included in a heat dissipation material, hence it is possible to reduce contact thermal resistance of the heat dissipation material to an adherend such as a heating element, a heat dissipation element, or the like. Also, by connecting the terminal parts of the multiple carbon nanotubes with each other by the coating films of DLC, it is possible to improve heat conductivity in the lateral direction and heat dissipation efficiency.

Also, by forming the coating film to cover the side surfaces of the carbon nanotubes, it is possible to improve mechanical strength of the carbon nanotubes in the vertical direction. This makes it possible to improve resistance to compression loaded during assembly.

Fourth Embodiment

A heat dissipation material and its manufacturing method will be described according to the fourth embodiment using FIGS. 14A-14D. Substantially the same elements as in the heat dissipation material and its manufacturing method according to the first to third embodiments are assigned the same numerical codes and their description may be omitted or simplified.

Figure 13:
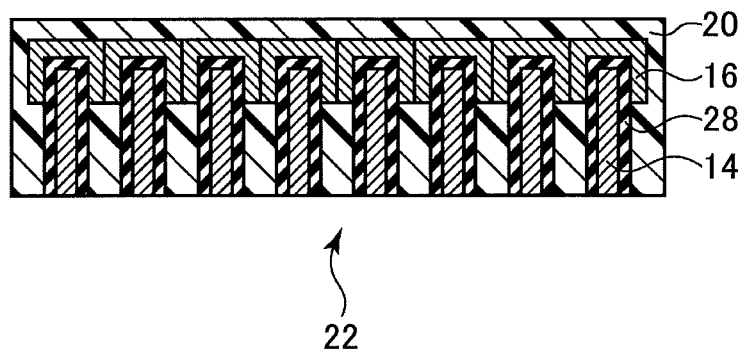
FIG. 13 is a plan view illustrating a structure of a heat dissipation material according to a fourth embodiment.

FIG. 13 is a general cross-sectional view illustrating a structure of a heat dissipation material according to the present embodiment. FIGS. 14A-14D are process cross-sectional views illustrating a method of manufacturing a heat dissipation material according to the present embodiment.

First, the structure of the heat dissipation material will be described according to the present embodiment using FIG. 13.

The heat dissipation material 22 includes multiple carbon nanotubes 14 as illustrated in FIG. 13 according to the present embodiment. The surfaces of the multiple carbon nanotubes 14 have coating films 28 formed uniformly, respectively. Terminal parts at one end of the multiple carbon nanotube 14 having the coating films 28 formed have coating films 16 of DLC formed. Gaps between the carbon nanotubes 14 having the coating films 28 and 16 formed are filled with the filler layer 20. These elements form the sheet-shaped heat dissipation material 22.

According to the fourth embodiment, the coating film 28 is formed after having the coating films 16 formed. Alternatively, the coating films 28 may be formed before having the coating films 16 formed as according to the present embodiment. Here, the forming method, forming material, film thickness and the like of the coating film 28 are the same as in the third embodiment.

If emphasis is put on contact thermal resistance between the carbon nanotubes 14 and the coating films 16 of DLC, it is desirable to adopt the structure according to the third embodiment, whereas if emphasis is put on water repellency of DLC, it is desirable to adopt the structure according to the present embodiment. Either one of the structures may be selected appropriately depending on the objective and the like.

Next, a method of manufacturing the heat dissipation material 22 will be described according to the present embodiment using FIGS. 14A-14D.

First, multiple carbon nanotubes 14 are formed on the substrate 10, for example, in a similar way to the method of manufacturing the heat dissipation material according to the first embodiment illustrated in FIGS. 3A-3D.

Figure 14A:
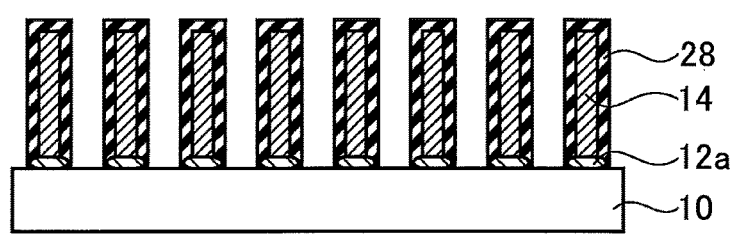
FIGS. 14A-14D are process cross-sectional views illustrating a method of manufacturing a heat dissipation material according to the fourth embodiment.

Next, by an ALD method, the coating films 28 of aluminum oxide ($Al_2O_3$) having the film thickness of, for example, 20 nm are formed on the surfaces of the carbon nanotubes 14 (FIG. 14A). By using the ALD method, it is possible to uniformly form the coating films 28 having a uniform film thickness on the whole surfaces of the carbon nanotubes 14.

Figure 14B:
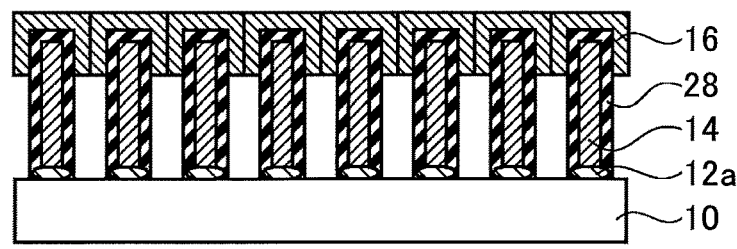
Figure 14C:
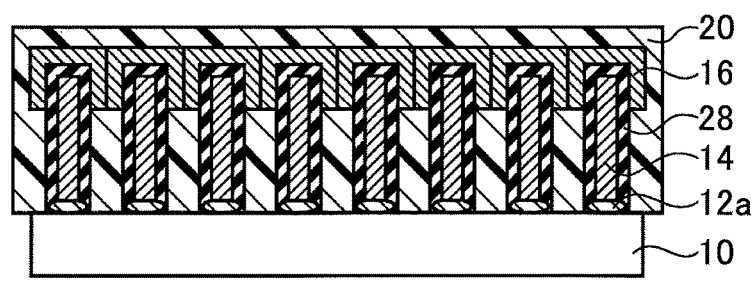

Next, the coating films 16 of DLC are formed at the upper terminal parts of the carbon nanotubes 14 having the coating films 28 formed, for example, in a similar way to the method of manufacturing the heat dissipation material according to the first embodiment illustrated in FIG. 3D (FIG. 14B).

Next, the filler layer 20 is formed in gaps between the carbon nanotubes 14 having the coating films 28 and 16 formed, for example, in a similar way to the method of manufacturing the heat dissipation material according to the first embodiment illustrated in FIGS. 4A-4D (FIG. 12C).

Figure 14D:
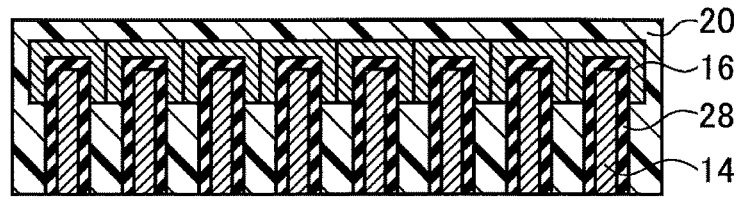

Next, the filler layer 20, in which the carbon nanotubes 14 having the coating films 28 and 16 formed are buried, is delaminated from the substrate 10 to complete the heat dissipation material 22 according to the present embodiment (FIG. 14D).

As seen from the above, according to the present embodiment, coating films of DLC are provided at terminal parts of carbon nanotubes included in a heat dissipation material, hence it is possible to reduce contact thermal resistance of the heat dissipation material to an adherend such as a heating element, a heat dissipation element, or the like. Also, by connecting the terminal parts of the multiple carbon nanotubes with each other by the coating films of DLC, it is possible to improve heat conductivity in the lateral direction and heat dissipation efficiency.

Also, by forming the coating films to cover the side surfaces of the carbon nanotubes, it is possible to improve mechanical strength of the carbon nanotubes in the vertical direction. This makes it possible to improve resistance to compression load during assembly.

Fifth Embodiment

An electronic device and its manufacturing method will be described according to the fifth embodiment using FIGS. 15-16D.

Figure 15:
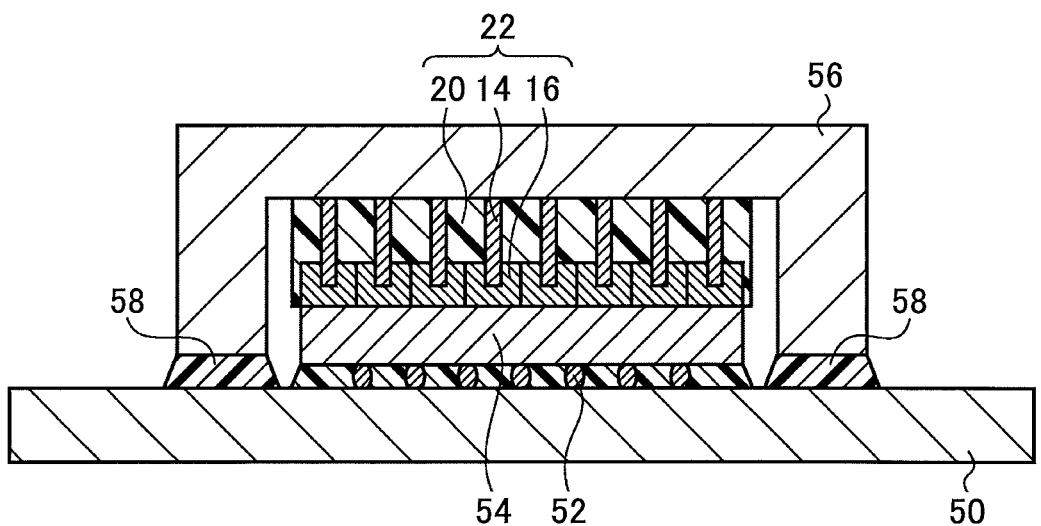
FIG. 15 is a plan view illustrating a structure of an electronic device according to a fifth embodiment.

FIG. 15 is a plan view illustrating a structure of the electronic device according to the present embodiment. FIGS. 16A-16D are process cross-sectional views illustrating a method of manufacturing the electronic device according to the present embodiment.

The electronic device using a heat dissipation material 22 according to one of the first to fourth embodiments and its manufacturing method will be described according to the present embodiment.

First, the structure of the electronic device will be described according to the present embodiment using FIG. 15.

A circuit board 50 such as a multi-layer wiring board has a semiconductor element 54 such as a CPU and the like mounted. The semiconductor element 54 is electrically connected with the circuit board 50 via a projection-shaped electrode 52 such as a solder bump.

The semiconductor element 54 has a heat spreader 56 formed above the semiconductor element 54 to be covered by the heat spreader 56 for spreading heat from the semiconductor element 54. A heat dissipation material 22 as described in one of the first to fourth embodiments is formed between the semiconductor element 54 and the heat spreader 56. FIG. 15 illustrates an example that uses the heat dissipation material 22 according to the first embodiment. The heat spreader 56 is bonded to the circuit board 50 with, for example, an organic sealant 58.

As can be seen from the above, the electronic device according to the present embodiment has the heat dissipation material 22 provided between the semiconductor element 54 and the heat spreader 56, or between a heat generation element and a heat dissipation element, where the heat dissipation material 22 is as described in one of the first to fourth embodiments.

As described above, the heat dissipation material 22 as described in one of the first to fourth embodiments has the carbon nanotubes 14 oriented in the film thickness direction of the sheet, and has very high thermal conductivity in the vertical direction. Also, one or both of the terminal parts of the carbon nanotubes 14 have the coating films 16 of DLC formed, which have extremely low contact thermal resistance, and high heat dissipation efficiency.

Therefore, by providing the heat dissipation material 22 according to one of the above embodiments between the semiconductor element 54 and the heat spreader 56, it is possible to conduct heat generated at the semiconductor element 54 to the heat spreader 56 efficiently, and to cool down the semiconductor element 54 effectively. This makes it possible to improve reliability of the electronic device.

Next, a method of manufacturing the electronic device will be described according to the present embodiment using FIGS. 16A-16D.

Figure 16A:
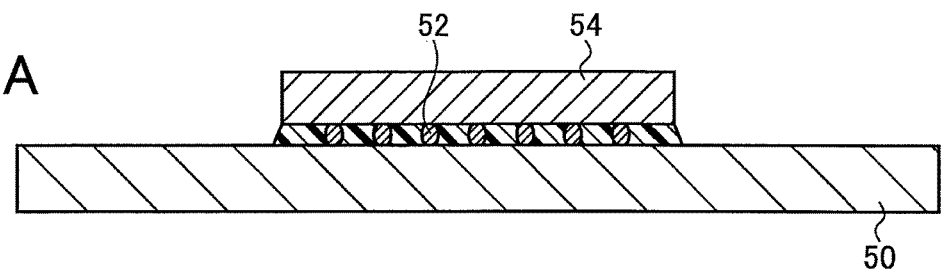
FIGS. 16A-16D are process cross-sectional views illustrating a method of manufacturing an electronic device according to the fifth embodiment.

First, the semiconductor element 54 is mounted on the circuit board 50 via the projection-shaped electrode 52 (FIG. 16A).

Figure 16B:
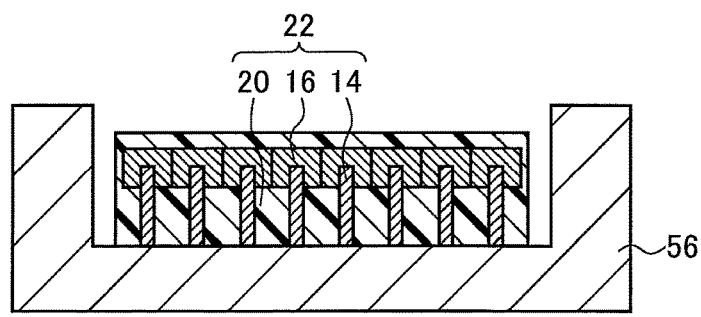

Also, the heat dissipation material 22 is bonded to the heat spreader 56 as a heat dissipation part (FIG. 16B). If a thermoplastic resin material is used for a filler layer 20 of the heat dissipation material 22, the heat dissipation material 22 is placed on the heat spreader 56 to be heated or cooled under pressure if necessary so that the heat dissipation material 22 is bonded to the heat spreader 56.

Here, when bonding the heat dissipation material 22 to the heat spreader 56, it is desirable to provide the heat dissipation material 22 so that the surface having the coating films 16 and 26 formed is positioned opposed to the heat spreader 56. This is because by placing the heat dissipation material 22 so that the surface having the coating films 16 and 26 formed is oriented towards the heating element (semiconductor element 54), heat from the heat dissipation element can be propagated efficiently in the lateral direction, and heat dissipation efficiency can be improved.

Figure 16C:
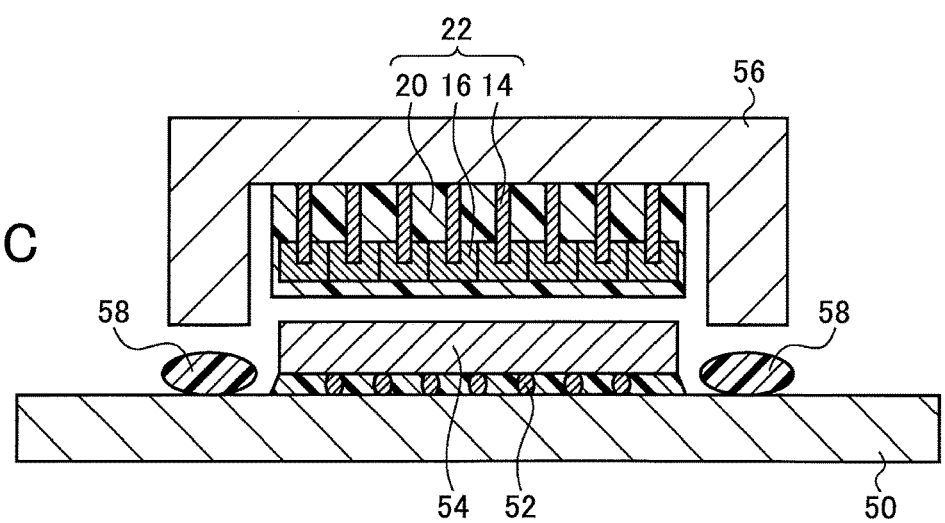
Figure 16D:
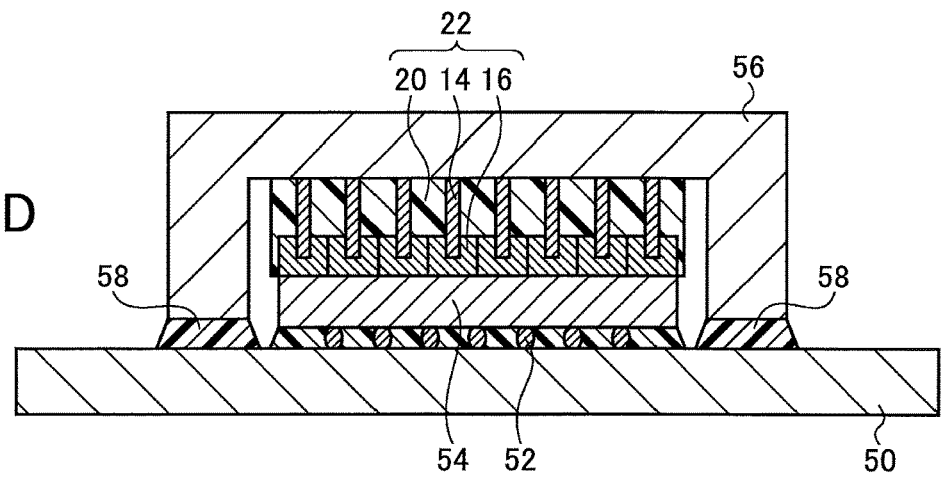

Next, an organic sealant 58 is applied on the circuit board 50 having the semiconductor element 54 mounted to fix the heat spreader 56, then the semiconductor element 54 is covered by the heat spreader 56 having the heat dissipation material 22 bonded (FIG. 16C). Here, the heat dissipation material 22 may not be bonded to the heat spreader 56 in advance, and the semiconductor element 54 may be covered by the heat spreader 56 in a state having the heat dissipation material 22 placed on the semiconductor element 54.

Next, heat is applied in a state where the heat spreader 58 is loaded, reflow is applied to the filler layer 20 of the heat dissipation material 22. If "Micromelt 6239" made by Henkel Japan Ltd. is used for the filler layer 20 of the heat dissipation material 22, for example, heat is applied for 10 minutes, for example, under the load of 0.25 MPa, and at 195° C.

By applying the heat, the thermoplastic resin forming the filler layer 20 of the carbon nanotube sheet is melted to be in a liquid state, which deforms the heat dissipation material 22 along concavities and convexities on the surfaces of the semiconductor element 54 and heat spreader 56. Also, the carbon nanotubes 14 in the heat dissipation material 22 become less restricted by the filler layer 20, and the terminal parts of the carbon nanotubes 14 come in contact with the semiconductor element 54 and the heat spreader 56 directly. At this moment, as the carbon nanotube 14 is by nature a pliant and flexible material, the carbon nanotubes 14 can bend following the concavities and convexities on the semiconductor element 54 and the heat spreader 56. This increases the number of carbon nanotubes 14 directly contacting the semiconductor element 54 and the heat spreader 56, which makes it possible to reduce contact thermal resistance considerably between the heat dissipation material 22 and the semiconductor element 54 or the heat spreader 56. The terminal parts of the carbon nanotubes 14 having the coating films 16 and 26 of DLC formed will become to have better contact with the semiconductor element 54 and the heat spreader 58 due to water repellency of DLC.

The load at this moment may be within a range of load with which the heat dissipation material 22 deforms along the concavities and convexities existing on the surface of the semiconductor element 54 and the heat spreader 56 to be in a sufficient contact state. Also, the temperature and time of heat application may be selected within a range so that the thermoplastic resin existing at the interface between the semiconductor element 54 and the heat spreader 56 can melt and move, so that the terminal parts of the carbon nanotubes 14 form a surface directly contacting the semiconductor element 54 and the heat spreader 58.

Also, the heat dissipation material 22 including the carbon nanotubes 14 whose surfaces have the coating films 28 formed has improved resistance to compression because the mechanical strength of the carbon nanotubes 14 is improved. This makes it possible to reduce likelihood of characteristic degradation of the heat dissipation material 22 that could occur if the carbon nanotubes 14 buckle which disturbs the orientation and reduces heat conductivity and the like.

Next, it is cooled down to room temperature to solidify the thermoplastic resin of the filler layer 20 and to fix the heat spreader 56 on the circuit board 50 by the organic sealant 58. At this moment, the thermoplastic resin reveals adhesiveness that makes the semiconductor element 54 and the heat spreader 56 bonded and fixed by the heat dissipation material 22. This makes it possible to maintain low contact thermal resistance between the heat dissipation material 22 and the semiconductor element 54 or the heat spreader 56 after having cooled down to room temperature.

As seen from the above, according to the present embodiment, a heat dissipation material according to one of the first to fourth embodiments is placed between the semiconductor element and the heat spreader, hence it is possible to considerably improve thermal conductivity between these elements. This makes it possible to improve heat dissipation efficiency of heat generated by a semiconductor element and to improve reliability of an electronic device.

Modified Embodiment

Embodiments are not limited to the above, but various modifications are possible.

For example, although the surfaces of the coating films 16 are covered by the filler layer 20 according to the first, second and fourth embodiments, the surfaces of the coating films 16 may be exposed from the filler layer 20. This can be realized by appropriately setting the film thickness of the thermoplastic resin sheet 18 if the filler layer 20 is formed using the thermoplastic resin sheet 18. If using another filler material with a spin coat method or the like, it can be realized by appropriately setting rotational speed of a spin coater, viscosity of application liquid, and the like. Alternatively, etching may be applied after having the filler layer 20 formed to make the surfaces of the coating film 16 exposed.

Also, although only terminal parts at one end of the carbon nanotubes 14 have the coating films 16 formed according to the third and fourth embodiments, both the terminal parts of the carbon nanotubes 14 may have the coating films 16 and 26 formed as in the second embodiment.

Also, although a heat dissipation material using carbon nanotubes is described as an example of linearly-structured carbon atoms according to the above embodiments, linearly-structured carbon atoms are not limited to carbon nanotubes. Linearly-structured carbon atoms other than carbon nanotubes include carbon nanowires, carbon rods, carbon fiber, and the like. These linearly-structured carbon atoms are similar to carbon nanotubes except that the sizes are different. It is possible to realize a heat dissipation material with these linearly-structured carbon atoms.

Also, the structures, configuration materials, manufacturing conditions, and the like of the heat dissipation material and electronic device in the above embodiment are merely described as examples, hence modifications and changes can be made appropriately with technological practices and the like of those skilled in the art.

Also, usage of a carbon nanotube sheet is not limited to those described in the above embodiments. The disclosed carbon nanotube sheet as a thermally-conductive sheet may have applications including, for example, a heat dissipation sheet of a CPU, a high-power output amplifier for a wireless communication base station, a high-power output amplifier for a wireless communication terminal, a high-power output switch for an electric vehicle, a server, a personal computer, and the like. Also, using a high permissible current density characteristic of carbon nanotubes, it can be used in a vertical wiring sheet and its various applications.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An electronic device comprising:
    a heating element;
    a heat dissipation element; and
    a heat dissipation material configured to be placed between the heating element and the heat dissipation element, and to include
        a plurality of linearly-structured objects of carbon atoms including a first terminal part and a second terminal part,
        a first diamond-like carbon layer configured to cover the first terminal part of each of the plurality of linearly-structured objects,
        a coating film covering a side surface for the first diamond-like carbon layer and the plurality of linearly-structured objects, and
        a filler layer configured to be permeated between the plurality of linearly-structured objects.

2. The electronic device as claimed in claim 1, wherein the first terminal parts of the plurality of linearly-structured objects are connected with each other by the first diamond-like carbon layers.

3. The electronic device as claimed in claim 1, further comprising:
    a second diamond-like carbon layer configured to cover the second terminal part of each of the plurality of linearly-structured objects.

4. The electronic device as claimed in claim 3, wherein the second terminal parts of the plurality of linearly-structured objects are connected with each other by the second diamond-like carbon layers.

5. The electronic device as claimed in claim 1, wherein the first terminal part of each of the plurality of linearly-structured objects covered by the first diamond-like carbon layer is placed at a side close to the heating element.

6. The electronic device as claimed in claim 1, wherein
    the first diamond-like carbon layer covers, for each of the plurality of linearly-structured objects, the first terminal part and a portion being adjacent to the first terminal part; and
    the coating film covers a surface of the first diamond-like carbon layer, and a side surface of each of the plurality of linearly-structured objects, which is not covered by the first diamond-like carbon layer.

* * * * *